United States Patent
You et al.

(10) Patent No.: US 6,449,754 B1
(45) Date of Patent: Sep. 10, 2002

(54) METHOD OF MEASURING THE ACCURACY OF PARASITIC CAPACITANCE EXTRACTION

(75) Inventors: Eileen H. You, San Jose; Weize Xie, Cupertino, both of CA (US); John F. MacDonald, Lake Oswego, OR (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/534,280

(22) Filed: Mar. 24, 2000

(51) Int. Cl.$^7$ .............................................. G06F 17/50
(52) U.S. Cl. .............................................. 716/5; 716/10
(58) Field of Search .......................... 716/1–11, 12–17; 703/5, 14–15, 19

(56) References Cited

U.S. PATENT DOCUMENTS

| | | | | |
|---|---|---|---|---|
| 5,568,395 A | * | 10/1996 | Huang | 703/13 |
| 5,706,206 A | * | 1/1998 | Hammer et al. | 716/4 |
| 5,896,300 A | * | 4/1999 | Raghavan et al. | 703/15 |
| 5,901,063 A | * | 5/1999 | Chang et al. | 703/5 |
| 5,923,568 A | | 7/1999 | Oh et al. | 716/1 |
| 6,068,660 A | * | 5/2000 | Lu | 703/2 |
| 6,212,492 B1 | * | 4/2001 | Kuge | 703/15 |
| 6,243,653 B1 | * | 6/2001 | Findley | 702/65 |
| 6,321,365 B1 | * | 11/2001 | McBride | 703/14 |

OTHER PUBLICATIONS

E. You, L. Varadadesikan, W. Xie and J. MacDonald, "A Practical Approach to Parasitic Extraction for Design of Multimillion–Transistor Integrated Circuits," Proc. Design Automation Conference, Jun. 2000, 7 pages.

* cited by examiner

Primary Examiner—Matthew Smith
Assistant Examiner—Paul Dinh
(74) Attorney, Agent, or Firm—Rosenthal & Osha L.L.P.

(57) ABSTRACT

A technique measuring accuracy of parasitic capacitance extraction defines the error in an extracted total net parasitic capacitance intended for timing analysis as a sum of the errors in the extracted values of the individual capacitance elements, with the error for each element being influenced by a weight factor. Similarly, the technique defines an error in the extracted value of a crosstalk factor for the net of interest as a difference between the errors in the extracted values of the individual capacitance elements, with the error in each element being influenced by a weight factor. For signal timing and crosstalk analyses, the weight factors allow a designer to focus calibration of the extraction tool on the capacitive element having the highest weight factor.

23 Claims, 4 Drawing Sheets

METHOD OF MEASURING THE ACCURACY OF PARASITIC CAPACITANCE EXTRACTION

The invention is related to extracting parasitic capacitance of integrated circuit interconnects and, in particular, to a method of determining the accuracy of the extraction.

BACKGROUND OF THE INVENTION

The speed at which signals propagate along an interconnection line, or interconnect, within an integrated circuit can be limited by the parasitic capacitance associated with the interconnect. In general, parasitic capacitance is the capacitance exerted on a circuit element such as an interconnect by the surrounding circuit elements. As semiconductor fabrication processes and design geometries shrink toward deep and ultra-deep submicron levels, the effect of interconnect parasitic capacitance on signal propagation becomes more pronounced. Therefore, a vital part of the integrated circuit design process is being able to accurately determine, or extract, parasitic capacitance.

One method of determining interconnect parasitic capacitance is by using a software tool called a 3-D field solver. 3-D field solvers are considered the most accurate of extraction tools because they calculate the actual lines of electromagnetic force induced by electric charges traveling through the interconnect to determine the interconnect parasitic capacitance. However, for an integrated circuit containing millions of transistors and interconnects, 3-D field solvers are extremely slow due to the enormous amount of data they have to process. In addition, preparing the input data for a 3-D field solver is a tedious and time-consuming task. Therefore, it is generally not cost-effective in terms of time and resources to use a 3-D field solver to compute the entire, full-chip interconnect parasitic capacitance of a multi-million transistor integrated circuit.

An alternative method is to estimate the full-chip interconnect parasitic capacitance using another software tool called a layout parameter extraction tool. This tool also uses a 3-D field solver, but only for creating a lookup table of parasitic capacitance models based on the particular process technology used to fabricate the circuit. The 3-D field solver calculates parasitic capacitance values based on layout parameters such as interconnect width, thickness, and proximity to other interconnects. These values are subsequently used to generate mathematical relationships or models for the parasitic capacitance based on the process technology. The models are stored in a lookup table along with the corresponding layout parameters. The tool then employs a pattern recognition algorithm to match the layout parameters of the circuit being designed with the parasitic capacitance models stored in the lookup table to generate the parasitic capacitance data for the circuit.

Tools for extracting interconnect parasitic capacitance are available to one of ordinary skill in the art such as StarRC™ from Avant! Corporation (http://www.avanticorp.com) and Fire & Ice™ from Simplex Solutions, Inc. (http://www.simplex.com).

Regardless of which tool is used, it is important to determine the accuracy of the data generated. The first step in accuracy determination is to generate a library of interconnect structures representative of the structures of the circuit being designed. Known or "golden" data for these test structures are then obtained using a 3-D field solver. The extraction tool is then applied to each test structure using the parasitic capacitance model of the extraction tool. The resulting data is compared to the known data. Finally, the extraction tool is adjusted, or calibrated, to reduce any errors to within a certain, predefined tolerance level.

Figure 1:
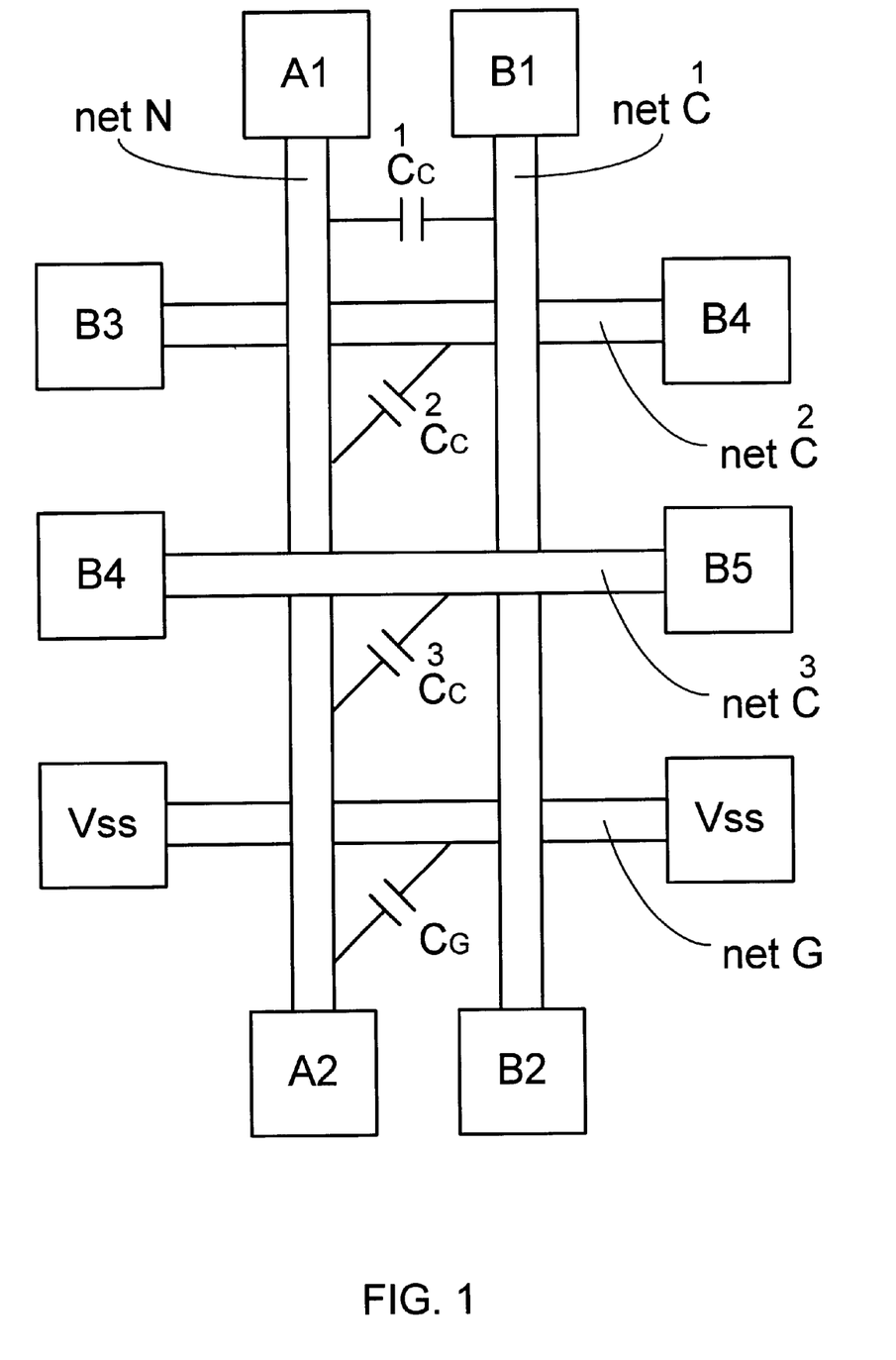
FIG. 1 is a schematic diagram showing a section of a circuit having several nets.

In general, parasitic capacitance is determined relative to a signal path or "net," which is one or more interconnects electrically linked together. FIG. 1 is a schematic diagram of a section of an integrated circuit showing several nets. Blocks A1 and A2 represent functional circuit elements such as a memory or a control unit and are connected by a signal-carrying or "switching" net, net N. Net N in this example is the "net of interest," that is, the net for which parasitic capacitance is to be extracted. Three other switching nets, net $\dot{C}$, net $\dot{C}$, and net $\dot{C}$ are on the same layer as, below, and above net N, respectively, and connect blocks B1 to B2, B3 to B4, and B5 to B6, which blocks represent other functional circuit elements in the circuit. Although three switching nets (other than the net of interest) are shown here, there may of course be more or less than three, depending on the type of circuit. For simplicity, these switching nets will henceforth be referred to generally as net $\dot{C}$, where i is any integer up to the number of switching nets having a capacitive influence on the net of interest. A static or non-switching net, net G, connects the grounds Vss and runs underneath net N.

Traditional extraction methods define the net capacitance $C_N$ of net N as:

$$C_N = C_G + \sum_i \dot{C}_C^i \quad (1)$$

where $C_G$ is a static or non-switching capacitance between net N and net G, i is an integer number representing the switching nets other than net N, and $\dot{C}_C$ is a coupling capacitance between net N and net $\dot{C}$. Also, an error $\delta_N$ between the extracted value of the net capacitance $C_N$ and a known or golden value $\tilde{C}_N$ is traditionally defined as:

$$\delta_N = \frac{C_N - \tilde{C}_N}{\tilde{C}_N} \quad (2)$$

However, for deep and ultra-deep submicron integrated circuits, the traditional net capacitance $C_N$ is not directly used in signal timing analysis.

Similarly, referring still to FIG. 1, for crosstalk noise analysis, traditional extraction methods define a crosstalk factor $K_C$ representing the crosstalk between net N and the other switching nets as:

$$K_C = \frac{\sum_i \dot{C}_C^i}{C_G + \sum_i \dot{C}_C^i} \quad (3)$$

The crosstalk factor error $\delta_K$ in the extracted value of the crosstalk factor $K_C$, like the error $\delta_N$ of equation (2), is traditionally defined as:

$$\delta_K = \frac{K_C - \tilde{K}_C}{\tilde{K}_C} \quad (4)$$

where $\tilde{K}_C$ is a known crosstalk factor for the given circuit.

SUMMARY OF THE INVENTION

The present invention is directed to a technique that defines an error in an extracted parasitic capacitance for a net of interest as a sum of the errors in the extracted values of the individual capacitance elements which make up the total parasitic capacitance, with the error of each element being influenced by a weight factor. For purposes of signal timing analysis, the capacitance element corresponding to the error having the highest weight factor will have the biggest impact on signal propagation delay.

Similarly, the technique of the present invention defines the error in the extracted value of a crosstalk factor for the net of interest as a difference between the errors in the extracted values of the individual capacitance elements, with the error in each element being influenced by a weight factor. For purposes of crosstalk analysis, the capacitance element corresponding to the error having the highest weight factor will have the biggest impact on crosstalk.

In one embodiment, the invention is related to a method of increasing the accuracy of an interconnect parasitic capacitance extraction tool. The method includes the steps of extracting a parasitic capacitance of a net of interest with the extraction tool, calculating the error between the extracted parasitic capacitance and a known parasitic capacitance, applying a weight factor to the error to produce a weighted error, and selectively adjusting the extraction tool based on the weighted error.

In one embodiment, the invention is related to a computer for extracting a parasitic capacitance of an integrated circuit interconnect. The computer includes a microprocessor and a storage medium. The storage medium stores computer-readable instructions for instructing the microprocessor to extract a parasitic capacitance of a net of interest, calculate an error between the extracted parasitic capacitance and a known parasitic capacitance, apply a weight factor to the error to produce a weighted error, and selectively adjust an extraction tool based on the weighted error.

In one embodiment, the invention is related to a method of designing an integrated circuit. The method includes defining the specifications for the integrated circuit, laying out the various circuit elements, and verifying the accuracy of the interconnect parasitic capacitance extraction tool. Verifying the accuracy of the extraction tool includes extracting a parasitic capacitance for a net of interest in the integrated circuit, calculating an error between the extracted parasitic capacitance and a known parasitic capacitance of the net of interest, applying a weight factor to the error to produce a weighted error, and selectively adjusting the extraction tool based on the weighted error. The adjusted extraction tool is used to extract the full-chip parasitic capacitance, and the integrated circuit is computer simulated using the extracted parasitic capacitance.

In one embodiment, the invention is related to a method of determining the accuracy of an interconnect parasitic capacitance extraction tool. The method includes extracting a static capacitance and a coupling capacitance of a net of interest with the extraction tool, calculating a static capacitance error between the extracted static capacitance and a known static capacitance of the net of interest, calculating a coupling capacitance error between the extracted coupling capacitance and a known coupling capacitance, applying a static capacitance weight factor to the static capacitance error to produce a weighted static capacitance error, applying a coupling capacitance weight factor to the coupling capacitance error to produce a weighted coupling capacitance error, and selectively adjusting the extraction tool based on the weighted static capacitance error and the weighted coupling capacitance error.

In one embodiment, the invention is related to a method of determining the accuracy of an interconnect parasitic capacitance extraction tool. The method includes extracting a coupling capacitance and a net capacitance of a net of interest with the extraction tool, calculating a coupling capacitance error between the extracted coupling capacitance and a known coupling capacitance of the net of interest, and calculating a net capacitance error between the extracted net capacitance and a known net capacitance, applying a coupling capacitance weight factor to the coupling capacitance error to produce a weighted coupling capacitance error, applying a net capacitance weight factor to the net capacitance error to produce a weighted net capacitance error, and selectively adjusting the extraction tool based on the weighted coupling capacitance error and the weighted net capacitance error.

An advantage of the present invention is circuit designers can focus calibration of their extraction tool on the capacitance element with the highest weight factor. Other advantages will become apparent from the following description and from the claims.

DETAILED DESCRIPTION OF THE PREFERRED EMBODIMENTS

Reference is again made to the circuit section of FIG. 1 and the net of interest, net N, shown therein. For signal timing analysis of deep and ultra-deep submicron integrated circuits, it is more useful to define a total capacitance $C_T$ for net N. For the purpose of static timing analysis of the present invention, the total capacitance $C_T$ is defined as:

$$C_T = C_G + \sum_i M^i \cdot C_C^i \qquad (5)$$

where M is a Miller effect scaling factor. Use of the Miller effect scaling factor M is known to one having ordinary skill in the art and will not be discussed here except to say it ranges from 0–2, depending on the extent of the switching activity of net C.

The error $\delta_T$ between the extracted value of total capacitance $C_T$ of net N and the known value $\tilde{C}_T$ can be defined as:

$$\delta_T = \frac{C_T - \tilde{C}_T}{\tilde{C}_T} \qquad (6)$$

From equation (6), the total capacitance $C_T$ can be written as:

$$C_T = \tilde{C}_T(1+\delta_T) \qquad (7)$$

Similarly, the static and coupling capacitance $C_G$ and $\tilde{C}_C$ can also be written as:

$$C_G = \tilde{C}_G(1+\delta_G) \quad (8)$$

$$\overset{i}{C}_C = \overset{i}{\tilde{C}}_C(1+\overset{i}{\delta}_C) \quad (9)$$

Equations (7)–(9) can then be substituted into equation (5) to obtain the following equation:

$$\tilde{C}_T(1+\delta_T) = \tilde{C}_G(1+\delta_G) + \sum_i \overset{i}{M} \cdot \overset{\sim i}{C}_C\left(1+\overset{i}{\delta}_C\right) \quad (10)$$

Expanding equation (10) results in the following equation:

$$\tilde{C}_T + \tilde{C}_T \cdot \delta_T = \tilde{C}_G + \tilde{C}_G \cdot \delta_G + \sum_i \overset{i}{M} \cdot \overset{\sim i}{C}_C + \sum_i \overset{i}{M} \cdot \overset{\sim i}{C}_C \cdot \overset{i}{\delta}_C \quad (11)$$

Then, it follows from equation (5) that $C_T$ can be written as:

$$\tilde{C}_T = \tilde{C}_G + \sum_i \overset{i}{M} \cdot \overset{\sim i}{C}_C \quad (12)$$

Substituting equation (12) into the right side of equation (9) and canceling like terms results in the following equations:

$$\tilde{C}_T \cdot \delta_T = \tilde{C}_G \cdot \delta_G + \Sigma \overset{i}{M} \cdot \overset{\sim i}{C}_C \cdot \overset{i}{\delta}_C \quad (13)$$

and $$\delta_T = \delta_G \cdot \frac{\tilde{C}_G}{\tilde{C}_T} + \sum_i \overset{i}{M} \cdot \overset{i}{\delta}_C \cdot \frac{\overset{\sim i}{C}_C}{\tilde{C}_T} \quad (14)$$

From equation (14), it can be seen the error $\delta_T$ in the total capacitance $C_T$ of net N equals the sum of the static capacitance error $\delta_G$ and the coupling capacitance error $\overset{i}{\delta}_C$, with each error term being influenced by a weight factor. In the case of the static capacitance error $\delta_G$, this error is multiplied by a ratio of the known static capacitance over the known total capacitance, $\tilde{C}_G/\tilde{C}_T$. In the case of the coupling capacitance error $\overset{i}{\delta}_C$, each error $\overset{i}{\delta}_C$ is multiplied a known weight factor $$\sum_i \overset{i}{M} \cdot \overset{\sim i}{C}_c \Big/ \tilde{C}_T.$$

One advantage of equation (14) is the weight factors allow circuit designers to focus calibration of the extraction tool on either the coupling capacitance error $\overset{i}{\delta}_C$ or the static capacitance error $\delta_G$, whichever has the higher weight factor. Another advantage is the weight factors are composed of known or golden values, thus assuring the accuracy of the weight factors.

Because a typical circuit has an enormous number of switching nets and the parasitic capacitance for each net must be extracted, and the errors for the nets of interest in an error matrix $\Delta_T$, where each element of the matrix holds an error $\delta_T$ for each net of interest. The accuracy of the extraction tool can then be ascertained by an appropriate evaluation of the entire error matrix $\Delta T$.

The definition of parasitic extraction accuracy in the present invention thus far has been with reference to signal timing analysis. Following now is a description of the technique with reference to crosstalk noise analysis.

Referring still to FIG. 1 and substituting equation (1) into equation (3) from above, the crosstalk factor $K_C$ can be written as:

$$K_C = \frac{\sum_i \overset{i}{C}_C}{C_N} \quad (15)$$

Also, by rearranging equation (4), $K_C$ can be written as:

$$K_C = \tilde{K}_C(1+\delta_K) \quad (16)$$

Substituting equation (16) and equation (7) (shown above) into equation (15) results in the following equation:

$$\tilde{K}_C(1+\delta_K) = \frac{\sum_i \overset{\sim i}{C}_C\left(1+\overset{i}{\delta}_C\right)}{C_N} \quad (17)$$

Referring again to equation (15), it follows that the known crosstalk factor $\tilde{K}_C$ can be written as:

$$\tilde{K}_C = \frac{\sum_i \overset{\sim i}{C}_C}{\tilde{C}_N} \quad (18)$$

Also, by rearranging equation (2), $C_N$ can be written as:

$$C_N = \tilde{C}_N(1+\delta_N) \quad (19)$$

Substituting equations (18) and (19) into equation (17) results in the following equation:

$$\frac{\sum_i \overset{\sim i}{C}_C}{\tilde{C}_N}(1+\delta_K) = \frac{\sum_i \overset{\sim i}{C}_C\left(1+\overset{i}{\delta}_C\right)}{\tilde{C}_N(1+\delta_N)} \quad (20)$$

Next, the righthand side of equation (20) is multiplied by $(1-\delta_N)/(1-\delta_N)$ to obtain the following equation:

$$\frac{\sum_i \overset{\sim i}{C}_C}{\tilde{C}_N}(1+\delta_K) = \frac{\sum_i \overset{\sim i}{C}_C\left(1+\overset{i}{\delta}_C\right)}{\tilde{C}_N(1+\delta_N^2)} \cdot (1-\delta_N) \quad (21)$$

For any extraction tool to be useful, $\delta_N$ must be much less than 1 ($\delta_N \ll 1$). Therefore, equation (21) can be written as:

$$\frac{\sum_i \overset{\sim i}{C}_C}{\tilde{C}_N}(1+\delta_K) = \frac{\sum_i \overset{\sim i}{C}_C\left(1+\overset{i}{\delta}_C\right)}{\tilde{C}_N} \cdot (1-\delta_N) \quad (22)$$

Expanding and canceling like terms, equation (22) can be written as:

$$\sum_i \tilde{C}_C^{-i} + \sum_i \tilde{C}_C^{-i} \cdot \delta_K = \quad (23)$$

$$\sum_i \tilde{C}_C^{-i} + \sum_i \tilde{C}_C^{-i} \cdot \overset{i}{\delta}_C - \delta_N \cdot \sum_i \tilde{C}_C^{-i} - \delta_N \cdot \sum_i \tilde{C}_C^{-i} \cdot \overset{i}{\delta}_C$$

Solving equation (23) for $\delta_K$ results in the following equation:

$$\delta_K = \frac{\sum_i \tilde{C}_C^{-i} \cdot \overset{i}{\delta}_C}{\sum_i \tilde{C}_C^{-i}} - \left(1 + \frac{\sum_i \tilde{C}_C^{-i} \cdot \overset{i}{\delta}_C}{\sum_i \tilde{C}_C^{-i}}\right) \delta_N \quad (24)$$

As can be seen from equation (24), the crosstalk factor error $\delta_K$ equals the difference between the coupling capacitance error $\overset{i}{\delta}_C$ and the net capacitance error $\delta_N$, with each error term being influenced by a weight factor. In the case of the coupling capacitance error $\overset{i}{\delta}_C$, each error $\overset{i}{\delta}_C$ is multiplied by a known ratio $$\tilde{C}_C^{-i} \Big/ \left(\sum_i \tilde{C}_C^{-i}\right).$$

In the case of the net capacitance error $\delta_N$, this error is multiplied by $$\left(1 + \sum_i \tilde{C}_C^{-i} \cdot \overset{i}{\delta}_C \Big/ \sum_i \tilde{C}_C^{-i}\right).$$

Figure 2:
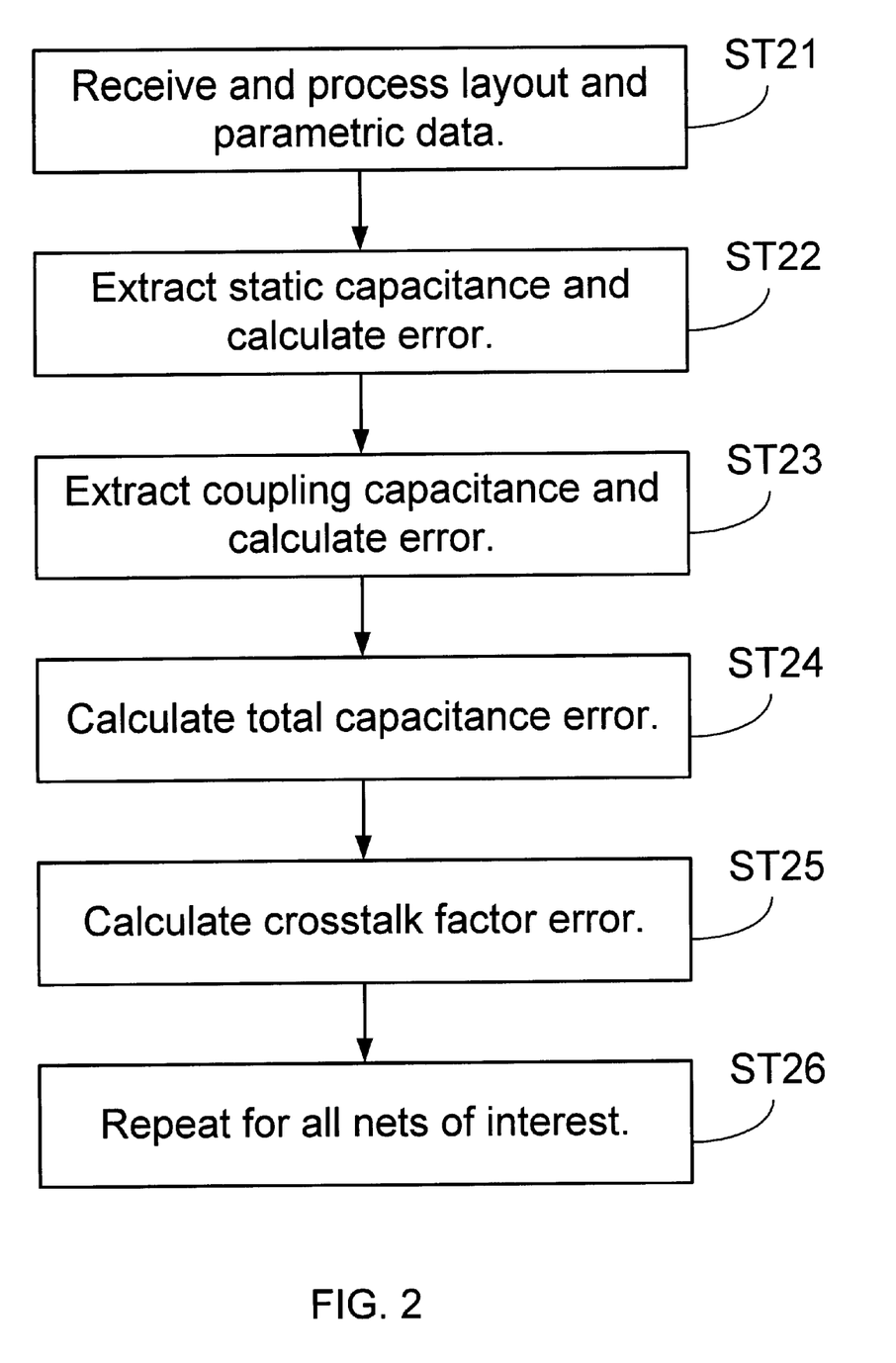
FIG. 2 is a flowchart of an accuracy determination operation in accordance with an embodiment of the extraction tool of the present invention.

Referring now to FIG. 2, the error determination operation of the present invention begins by receiving and processing layout and parametric data for a predetermined test circuit (ST21). Then a static capacitance $C_G$ is extracted and the error $\delta_G$ in the extracted value is calculated (ST22). The coupling capacitance $\overset{i}{C}_C$ is then extracted and the error $\overset{i}{\delta}_C$ is calculated (ST23) for each switching net i. Using this data, a total capacitance error $\delta_T$ (ST24) and a crosstalk factor error $\delta_K$ (ST25) for the net of interest is calculated. These calculations are repeated in turn until all nets of interest for the test circuit have been extracted (ST26). The resulting data are then stored, usually in matrix form, for circuit designers to access and evaluate.

Figure 3:
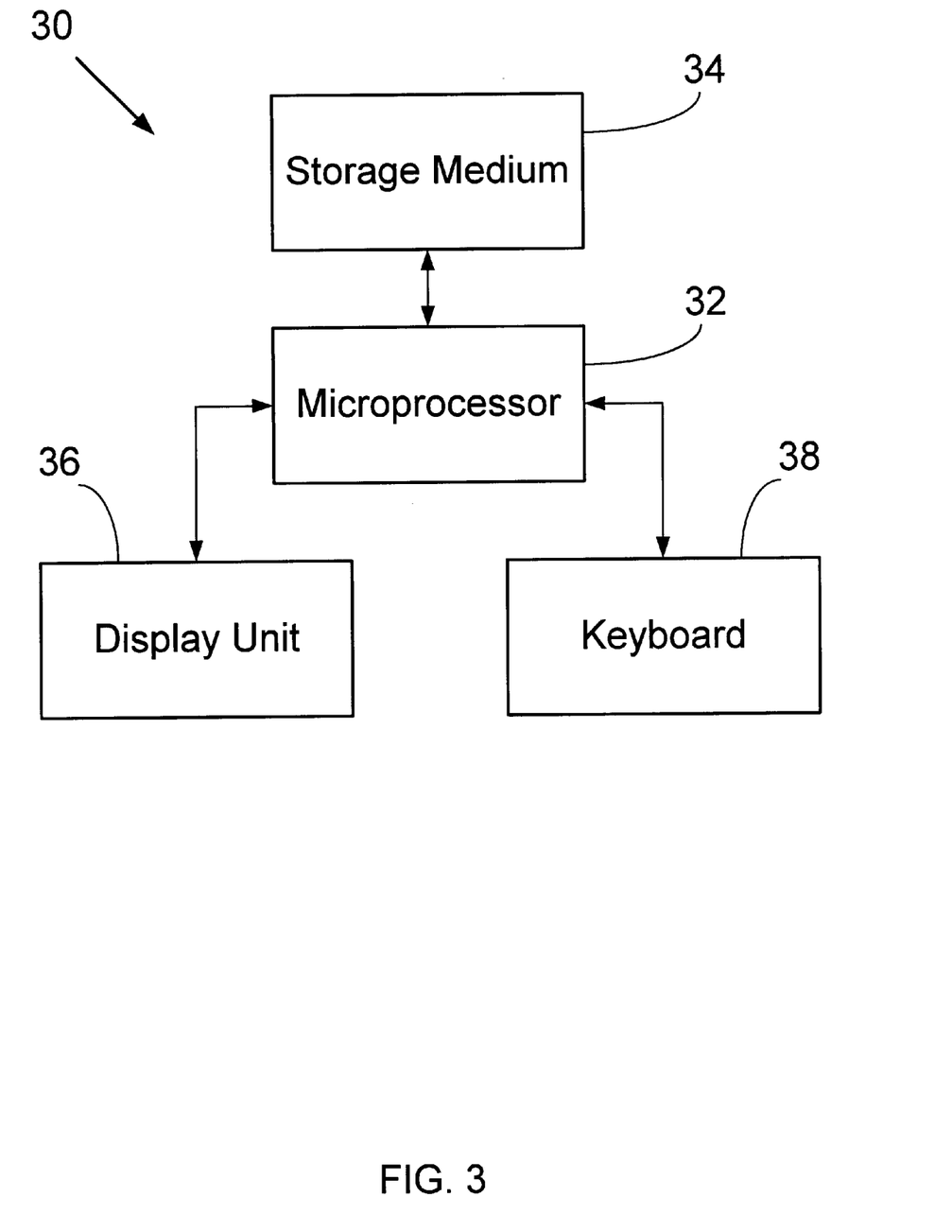
FIG. 3 is a schematic diagram showing a computer for running the extraction tool of the present invention.

In some embodiments, the accuracy definition in the present invention may be stored and executed by a computer such as the one schematically depicted in FIG. 3. The computer 30 comprises, among other things, a microprocessor 32, a storage medium 34, a display unit 36, and a keyboard 38. The storage medium 34 stores the extraction tool as computer-readable instructions for instructing the microprocessor 32 to execute the steps generally shown in FIG. 2. The display unit 36 visually displays data produced by the microprocessor 32, and the keyboard 38 allows a user to manually input data into the microprocessor 32.

Figure 4:
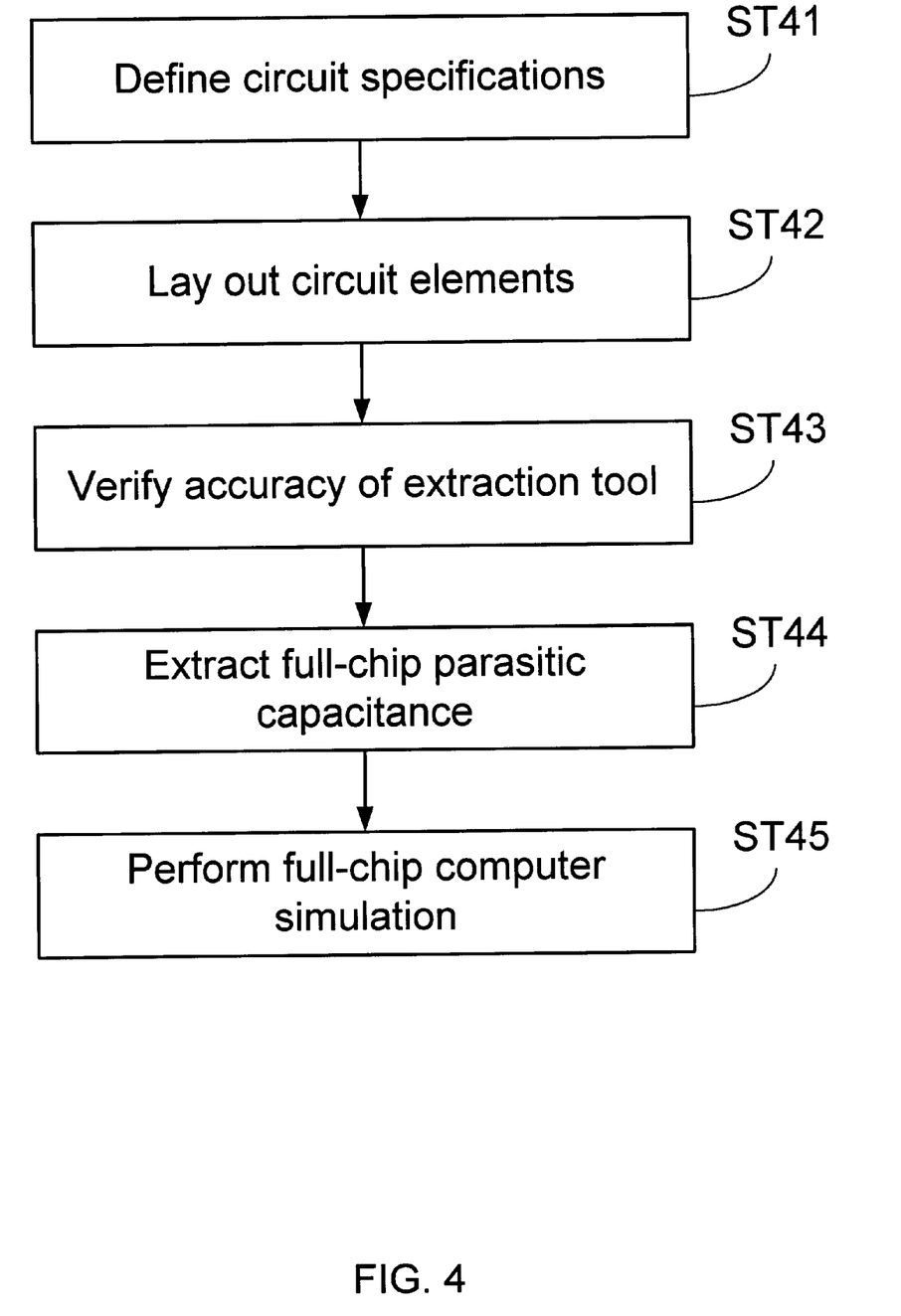
FIG. 4 is a flowchart of a design process using the extraction tool of the present invention.

In some embodiments, the computer 30 of FIG. 3 can be used to aid the design process generally shown in the flowchart of FIG. 4. The first step in the design process is to define the circuit specifications and parameters including functionality, features, speed, power consumption, and size (ST41). Next, the various circuit elements, for example, clock generator, memory, and controller, must be laid out and arranged within the allotted die or chip area (ST42). Once this is done, the accuracy of the extraction tool stored on the computer 30 is verified in the manner previously described and shown in FIG. 2 (ST43). Once the accuracy of the tool has been verified to within a certain, predefined level, the tool is used to extract the full-chip parasitic capacitance of the integrated circuit (ST44). A simulation of the entire circuit is then performed (ST45) including timing and crosstalk analyses. After the simulation is successfully completed, the design may be released to the wafer fab to begin volume production.

It is to be understood the embodiments described herein are illustrative only, and other embodiments may be derived by one having ordinary skill in the art without departing from the scope of the invention. Accordingly, the scope of the invention should be limited only by the following claims.

What is claimed is:

1. A method of increasing an accuracy of an interconnect parasitic capacitance extraction tool, comprising:
   extracting a parasitic capacitance for a net of interest with the extraction tool;
   calculating an error between the extracted parasitic capacitance and a known parasitic capacitance of the net of interest;
   applying a weight factor to the error to produce a weighted error; and
   selectively adjusting the extraction tool based on the weighted error.

2. The method of claim 1, wherein the extraction tool is adjusted by the weight factor.

3. The method of claim 1, wherein the extracted parasitic capacitance is a static capacitance.

4. The method of claim 1, wherein the extracted parasitic capacitance is a coupling capacitance.

5. The method of claim 1, wherein the error is equal to the extracted parasitic capacitance minus the known parasitic capacitance, divided by the known parasitic capacitance.

6. The method of claim 1, wherein the weight factor is equal to a known static capacitance divided by a known total capacitance.

7. The method of claim 1, wherein the weight factor is equal to a known coupling capacitance divided by a known total capacitance.

8. The method of claim 7, wherein the weight factor is multiplied by a Miller factor.

9. The method of claim 1, wherein the weight factor is equal to A divided by B, wherein A is a product of a known coupling capacitance and a coupling capacitance error, and wherein B is the known coupling capacitance.

10. The method of claim 1, wherein the weight factor is equal to 1+A/B, wherein A is a product of a known coupling capacitance and a coupling capacitance error, and wherein B is the known coupling capacitance.

11. A computer for extracting a parasitic capacitance of an integrated circuit interconnect, comprising:
   a microprocessor; and
   a storage medium storing computer-readable instructions for instructing the microprocessor to:
   (a) extract a parasitic capacitance of a net of interest;
   (b) calculate an error between the extracted parasitic capacitance and a known parasitic capacitance of the net of interest;
   (c) apply a weight factor to the error to produce a weighted error; and
   (d) selectively adjust an extraction tool based on the weighted error.

12. The computer of claim 11, wherein the extraction tool is adjusted by the weight factor.

13. The computer of claim 11, wherein the extracted parasitic capacitance is a static capacitance.

14. The computer of claim 11, wherein the extracted parasitic capacitance is a coupling capacitance.

15. The computer of claim 11, wherein the error is equal to the extracted parasitic capacitance minus the known parasitic capacitance, divided by the known parasitic capacitance.

16. The computer of claim 11, wherein the weight factor is equal to a known static capacitance divided by a known total capacitance.

17. The computer of claim 11, wherein the weight factor is equal to a known coupling capacitance divided by a known total capacitance.

18. The computer of claim 17, wherein the weight factor is multiplied by a Miller factor.

19. The computer of claim 11, wherein the weight factor is equal to A divided by B, wherein A is a product of a known coupling capacitance and a coupling capacitance error, and wherein B is the known coupling capacitance.

20. The computer of claim 11, wherein the weight factor is equal to 1+A/B, wherein A is a product of a known coupling capacitance and a coupling capacitance error, and wherein B is the known coupling capacitance.

21. A method of designing an integrated circuit, comprising:
    defining specifications for the integrated circuit;
    laying out circuit elements;
    verifying an accuracy of an interconnect parasitic capacitance extraction tool, including:
        (a) extracting a parasitic capacitance for a net of interest in the integrated circuit using the extraction tool;
        (b) calculating an error between the extracted parasitic capacitance and a known parasitic capacitance of the net of interest;
        (c) applying a weight factor to the error to produce a weighted error; and
        (d) adjusting the extraction tool based on the weighted error;
    extracting a full-chip parasitic capacitance for the integrated circuit using the adjusted extraction tool; and
    computer simulating the integrated circuit using the extracted parasitic capacitance.

22. A method of increasing an accuracy of an interconnect parasitic capacitance extraction tool, comprising:
    extracting a static capacitance and a coupling capacitance of a net of interest with the extraction tool;
    calculating a static capacitance error between the extracted static capacitance and a known static capacitance of the net of interest;
    calculating a coupling capacitance error between the extracted coupling capacitance and a known coupling capacitance of the net of interest;
    applying a static capacitance weight factor to the static capacitance error to produce a weighted static capacitance error;
    applying a coupling capacitance weight factor to the coupling capacitance error to produce a weighted coupling capacitance error; and
    selectively adjusting the extraction tool based on the weighted static capacitance error and weighted coupling capacitance error.

23. A method of increasing an accuracy of an interconnect parasitic capacitance extraction tool, comprising:
    extracting a coupling capacitance and a net capacitance of a net of interest with the extraction tool;
    calculating a coupling capacitance error between the extracted coupling capacitance and a known coupling capacitance of the net of interest;
    calculating a net capacitance error between the extracted net capacitance and a known net capacitance of the net of interest;
    applying a coupling capacitance weight factor to the coupling capacitance error to produce a weighted coupling capacitance error;
    applying a net capacitance weight factor to the net capacitance error to produce a weighted net capacitance error; and
    selectively adjusting the extraction tool based on the weighted coupling capacitance error and weighted net capacitance error.

* * * * *

UNITED STATES PATENT AND TRADEMARK OFFICE
CERTIFICATE OF CORRECTION

PATENT NO. : 6,449,754 B1
DATED : September 10, 2002
INVENTOR(S) : Eileen H. You et al.

It is certified that error appears in the above-identified patent and that said Letters Patent is hereby corrected as shown below:

<u>Column 5,</u>
Line 19, replace "$C_T$" with "$\widetilde{C}_T$".

Line 30, replace equation (13) with "$\widetilde{C}_T \cdot \delta_T = \widetilde{C}_G \cdot \delta_G + \sum \overset{i}{M} \overset{-i}{Cc} \cdot \overset{i}{\delta}$".

Line 50, replace "$\sum_i \overset{i}{M} \cdot \overset{-i}{Cc} / \widetilde{C}_T$" with "$\sum \overset{i}{M} \cdot \overset{-i}{Cc} / \widetilde{C}_T$".

Signed and Sealed this

Eleventh Day of March, 2003

JAMES E. ROGAN
*Director of the United States Patent and Trademark Office*